United States Patent [19]

Keller et al.

[11] Patent Number: 4,556,823

[45] Date of Patent: Dec. 3, 1985

[54] MULTI-FUNCTION CHARGED PARTICLE APPARATUS

[75] Inventors: John H. Keller, Newburgh; James R. Winnard, Poughkeepsie, both of N.Y.

[73] Assignee: International Business Machines Corporation, Armonk, N.Y.

[21] Appl. No.: 518,229

[22] Filed: Jul. 28, 1983

[51] Int. Cl.⁴ .................... H01J 7/24; H05B 31/26
[52] U.S. Cl. .................... 315/111.81; 315/3; 250/396 R; 313/436; 313/361.1
[58] Field of Search ............... 315/3, 111.81, 111.91; 313/436, 450, 361.1; 250/396, 396 R

[56] References Cited

U.S. PATENT DOCUMENTS

| | | | |
|---|---|---|---|
| 2,179,097 | 11/1939 | Law . | |
| 2,817,044 | 12/1957 | Hinderer . | |
| 3,147,445 | 9/1964 | Wuerker et al. | 315/3 X |
| 3,407,323 | 10/1968 | Hand | 250/396 X |
| 3,500,121 | 3/1970 | Sohl | 315/111.91 |
| 3,543,079 | 11/1970 | Uno et al. | 315/3 |
| 3,648,046 | 3/1972 | Denison et al. | 250/41.9 DS |
| 3,665,245 | 5/1972 | Schwarz | 315/111.91 |
| 3,794,876 | 2/1974 | Van Alphen | 315/17 |
| 3,816,748 | 6/1974 | Harrison | 313/361.1 |
| 3,997,846 | 12/1976 | Coultas et al. | 328/229 |
| 4,185,226 | 1/1980 | Heymann | 315/13 ST |
| 4,214,160 | 7/1980 | Fies et al. | 250/292 |
| 4,392,080 | 7/1983 | Maschke | 315/3 |

*Primary Examiner*—Saxfield Chatmon
*Attorney, Agent, or Firm*—Manny W. Schecter; J. Villella; J. Jordan

[57] ABSTRACT

An apparatus capable of simultaneous focusing, positioning, and scanning of an ion beam is described. The apparatus uses metallic elements to form the sides of an open-ended substantially box-shaped structure. Application of AC and DC currents to the four corners of the structure create AC and DC fields within the structure that deflect an ion beam so as to perform the functions of positioning, focusing, and scanning. The center of focusing of the ion beam is placed closer to the center of scanning of the ion beam than in conventional ion beam deflection systems. As a result, the tendency of space charge beam blow-up during scanning is greatly diminished. By combining the functions of positioning, focusing, and scanning in one deflection element, the length of an ion beam deflection system is reduced, and the current capability is greatly increased.

18 Claims, 3 Drawing Figures

MULTI-FUNCTION CHARGED PARTICLE APPARATUS

DESCRIPTION

1. Technical Field

This invention relates to an apparatus for deflecting ion beams. More particularly, the invention relates to an apparatus capable of simultaneous focusing, positioning, and scanning of an ion beam.

2. Background Art

In ion beam systems, a suitable ion source produces a plurality of ions which constitute the beam. The ion beam is accelerated and/or decelerated as well as deflected along a path from the ion source to a target. Three key operations that must be performed on the ion beam traversing the path from ion source to target are focusing, positioning, and scanning. Focusing refers to the function of reducing the cross sectional area of the ion beam. Typically, the ion beam is first focused in the X-direction and then focused in the Y-direction. As is well known, focusing a beam of charged particles in one direction tends to make the beam expand in the other direction. For example, after a beam has been focused in the X-direction, the beam width in the Y-direction increases, thus the need for focusing in both the X and Y-directions.

Scanning refers to the function of moving the beam in one or more directions in a controlled manner across the target. As with focusing, it is usual to scan the beam across the target in both the X and Y-directions. By so doing, the beam may be moved both horizontally and vertically across the target. Scanning encompasses the dynamic movement of the beam.

Positioning refers to the function of displacing the beam horizontally, vertically, or both with respect to the central axis of the ion beam system. Unlike scanning, positioning encompasses only the static or steady state movement of the beam. By changing the beam position, one merely changes the point on the target that the beam strikes. The function of positioning does not move the beam back and forth across the target in a dynamic manner.

In conventional ion beam systems, scanning, positioning, and focusing are carried out using either parallel plates or parallel cylinders to deflect the charged particles over the intended path. Electric potentials applied to the plates or cylinders create electric fields between the plates or cylinders. These electric fields may be controllably varied to effect the desired focusing, positioning, or scanning since a charged particle beam such as an ion beam will be deflected under the force of an electric field. In a typical system, there are separate plate or cylinder elements for each of the functions of X and Y-focusing and X and Y-scanning as well as for X and Y-positioning. For example, a beam entering the focusing and scanning portion of a system will first pass through the X-focus plates. Next the beam will traverse the Y-focus plates, then the Y-scan plates and finally the X-scan plates. The overall distance that the beam must traverse from the time it enters the X-focus plates to the time it exits the X-scan plates is on the order of two to four feet.

As is well known, when the beam current increases, there is a tendency for beam blow-up, i.e., for the beam to expand. This is one of the phenomena that the focusing elements are used to overcome. However, as the length of the focusing and scanning sections of an ion beam system increases, the focusing elements become further removed from the scanning elements. Although a beam may be well focused after it has left the X and Y-focusing elements, it will tend to defocus in the X and Y-scanning elements. This tendency to expand is caused by the mutual repulsion of the like-charged particles constituting the beam. As the scanning elements become further removed from the focusing elements, the beam size in the scannning element decreases which increases the defocusing at the scanning elements.

It would be more desirable to shorten the length of the focusing and scanning sections of an ion beam system such that the tendency of the beam to expand or defocus decreases while the beam is being scanned. This is especially important for high current ion beam (beam currents in excess of 100 uA). The closer the center of focusing of the beam is placed to the center of scanning of the beam, the less likelihood there is that the beam will become defocused during the scanning operation. A system that could combine scanning and focusing in one physical element would substantially eliminate the defocusing problem during scanning. By additionally combining the function of positioning along with focusing and scanning, the overall length of an ion beam system is considerably shortened.

A problem that arises with the use of conventional parallel plate or cylinder systems, is the distortion of the beam as it traverses the focusing and scanning elements. The reasons for distortion are twofold. First, with a parallel plate system, there is a tendency for the beam to distort due to the edge effects in the area of the beam. In a parallel plate system, the field lines from the top to the bottom plate display an outward curvature. This curvature of field lines in a parallel plate system is well known. The curvature becomes more pronounced at the outer edges of the plates. As a result, the electric field in the center of the plates will not be equal to the electric field at the edges of the plates. Consequently, a charged particle beam will undergo a different deflection when it is located in the center of the plates than when the beam is located at the edges of the plates. This non-uniformity is to be avoided.

The second reason for distortion of the ion beam is coupling of signals from the X-plates to the Y-plates and vice versa due to the close proximity of the X and Y-plates. This cross-coupling changes the electric fields within a given set of plates so that the ion beam does not deflect along its intended path. Consequently, there is a need for an ion beam system wherein the coupling between X and Y-plates is minimized, and the edge effects are substantially eliminated. This result may be accomplished using a box-shaped system formed of resistive elements terminated at the corners of the box by metallic conductors. Such a resistive box-shaped system produces uniform distortionless electric fields which can be controllably varied to effect the required beam deflection function. By superimposing AC fields upon DC fields simultaneous scanning, positioning, and focusing is accomplished.

Accordingly, it is an object of this invention to provide an improved ion beam deflection system.

It is another object of this invention to provide an ion beam system wherein simultaneous focusing, positioning, and scanning of an ion beam is accomplished within one deflection element.

It is a further object of this invention to provide an ion beam system composed of a resistive box designed so as to eliminate distortion of the field lines within the box.

DISCLOSURE OF THE INVENTION

The present invention relates to an ion beam system wherein a substantially box-shaped structure of resistive elements performs simultaneous focusing, positioning, and scanning of a high current ion beam. Specifically, the structure enables the simultaneous scanning and focusing of an ion beam in a first direction while enabling the scanning of the ion beam in a second direction and the positioning of the beam in a first and a second direction. The four corners of the box-shaped structure are terminated with conductive elements to which AC and DC current sources are connected. A first pair of diagonally opposed conductors are used to receive AC and DC currents which enable focusing, positioning, and scanning in a first direction by creating AC and DC fields within the box-shaped structure that operate on the ion beam in the first direction. The second pair of diagonally opposed conductors are connected to additional sources of AC and DC current which enable scanning and positioning the ion beam in a second direction by creating AC and DC fields within the box-shaped structure that operate on the ion beam in the second direction.

The result of performing simultaneous focusing and scanning within a single ion beam deflection unit is the placement of the center of focusing of the beam closer to the center of scanning of the beam. The present invention uses a single deflection element to focus and scan in a first direction while simultaneously scanning in a second direction. A second element is used to focus the ion beam in a second direction. This has the effect of considerably shortening the total length of the focusing and scanning section of an ion beam system. As a result, the distance that the ion beam must traverse from the time it enters the focusing and scanning section of an ion beam system until the time it leaves the scanning section is considerably shortened. Consequently, the ion beam displays a greater tendency to remain focused at the target than with a system having separate elements for focusing and scanning in each of two directions.

The resistive nature of the box-shaped structure is accomplished by forming the perimeter of the box-shaped structure with a plurality of metallic conductors which are electrically isolated from one another. The metallic conductors are held in place using a box-shaped dielectric superstructure to which the conductors are attached. Between adjacent pairs of metallic conductors, are connected resistors of a very high value. Combined with the metallic cylinders, the resistors form a voltage divider network stepping down the electric potentials at each of the four terminals of the structure. The values of resistance are chosen so as to create a controlled electric field within the structure.

Applying a DC current to a first and a second pair of terminals creates a quadrupole electric field within the structure. This uniformly applied electric field acts to focus the ion beam in a first direction, i.e., to reduce the diameter of the beam in that first direction. Prior to entering the box-shaped structure, the beam has been focused in a second direction by a separate focusing element. A conventional focusing element is used for this purpose. By applying a second DC current to the first pair of terminals the uniform electric field is altered so as to change the position of the beam in the first direction. Likewise, applying a DC current to the second pair of terminals creates a uniform field within the structure that can be adjusted to change the position of the beam in the second direction.

A triangular-shaped AC current is applied to the first pair of terminals thus superimposing an AC current on the DC current already applied. By applying a second AC current to the second pair of terminals, the ion beam will be deflected by the resulting AC field to form a raster pattern such as exists in a standard television receiver system. The two AC currents applied to the two pairs of terminals operate at different frequencies. If the frequencies of the two AC currents were the same, then the scanned ion beam would produce a diagonal line rather than a raster scan across the target.

By increasing the magnitude of the AC currents, the ion beam may be made to move a further distance across the target. Thus, to increase the area covered by the scanned ion beam, it is necessary to increase the AC current magnitude. Scanning is carried out in both directions. For example, the beam will begin in the upper left hand corner of the target, scan across the target from left to right, move down, and then scan back across the target from right to left. This process continues until the ion beam has been scanned across the entire target a multiple number of times.

BEST MODE FOR CARRYING OUT THE INVENTION

Figure 1:
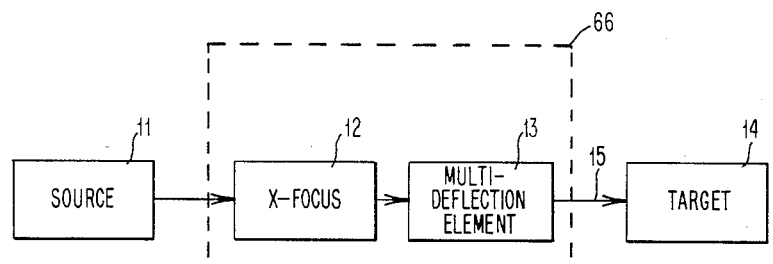
FIG. 1 is a block diagram of the preferred embodiment of the present invention.

A simplified version of an ion beam system according to the preferred embodiment of the present invention is shown in FIG. 1. A stream of ions produced by source 11 is accelerated towards the focusing, positioning and scanning section 66 of the ion beam system. It will be understood by those skilled in the art that a beam analyzing and accelerating apparatus is required immediately after source 11 to form the ions produced by source 11 into an ion beam 15 and to accelerate the ion beam 15 towards section 66. The analyzing and accelerating apparatus does not form a part of the present invention and will not be discussed further herein.

It will also be recognized by those skilled in the art that when scanning a high current ion beam (beam current in excess of 100 microamps) means must be provided for retaining space charge neutralization of ion beam 15. This is done by preserving the electron cloud formed about ion beam 15. One known method for accomplishing this is to use a pair of negatively biased gates, with one gate placed proximate each side of a deflection element. The gates are biased to a sufficient amplitude to repel electrons attracted to the positively biased sections of the deflection element, thereby protecting the electron cloud from degradation. In the apparatus of the present invention, one pair of gates would be placed proximate X-focus element 12 and a second pair of gates would be placed proximate multi-deflection element 13.

The ion beam 15 entering section 66 first passes through X-focus element 12. Prior to entering section 66, ion beam 15 has a diameter on the order of two inches. X-focusing element 12 is a standard quadrupole lens well known in charged particle beam systems. X-focus element 12 reduces the diameter of the ion beam in the X-direction.

The X-focused ion beam, after exiting X-focusing element 12, enters multi-deflection element 13. Element 13 performs three functions. The first function is to focus the ion beam 15 in the Y-direction thus reducing its diameter in the Y-direction. After Y-focusing has been performed, the overall diameter of the ion beam 15, is on the order of $\frac{1}{2}$ inch. Thus, after X and Y-focusing, the diameter of the ion beam 15 at target 14 has been reduced to $\frac{1}{4}$ of what the beam diameter was upon entering section 66. The current carrying capability of the ion beam system increases as the size of beam 15 in element 66 is increased.

The second and third functions performed by element 13 are to change the position of the ion beam 15 at target 14 if required and to scan the focused ion beam across target 14. The beam is scanned using a raster pattern across the entire surface of the target 14. The raster scanning pattern begins, for example, at the upper left hand corner of the target 14, proceeds across the target 14 to the upper right hand corner, moves down the target 14 and then moves from right to left across the target 14 returning to its left most position. This process continues until the ion beam 15 has been scanned across the entirety of target 14 a multiple of times. Adjacent scan lines overlap on the target. By overlapping adjacent scan lines and by repeating the scan a multiple of times, the possibility of depositing a non-uniform layer of ions on target 14 is substantially eliminated.

Figure 2:
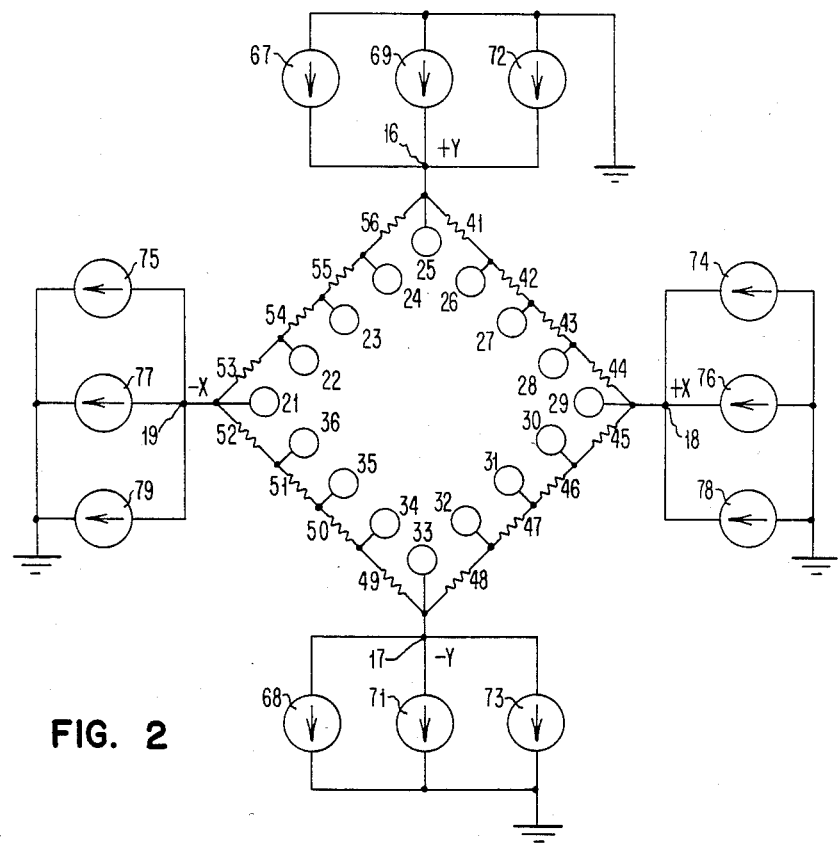
FIG. 2 is an equivalent circuit diagram of the focusing, positioning, and scanning apparatus of the present invention.
Figure 3:
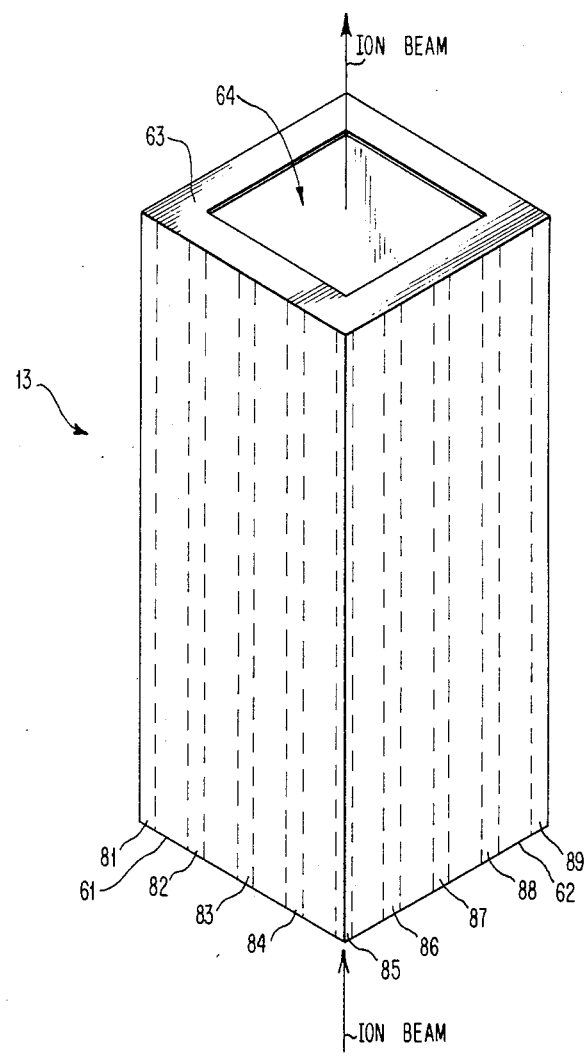
FIG. 3 is an enlarged perspective view of the focusing, positioning, and scanning apparatus of the present invention.

The construction of multi-deflection element 13 is shown more clearly in perspective in FIG. 3. The substantially box-shaped configuration of element 13 is formed using five equally spaced metallic conductors to form each of the four sides of the box. The metallic conductors are physically held in place by attaching them to a dielectric superstructure which has no effect on the electrical characteristics within the box-shaped structure. Sides 61 and 62 of the structure are shown containing five equally spaced metallic conductors on each side. Side 61 is shown having metallic conductors 81, 82, 83, 84, and 85 attached thereto. Similarly, side 62 is shown with metallic conductors 85 through 89 attached thereto. Note that metallic cylinder 85 is located at one of the corners of element 13. It is to the four corner conductors that current sources are connected. This will be explained in more detail in relation to FIG. 2. Although cylinders are used in the preferred embodiment to form element 13, other shaped conductors may be used. For example, half cylinders may be used equally well. For the sake of clarity, the resistive elements connected between adjacent pairs of metallic conductors is not shown in FIG. 3.

A partial covering 63 is placed over the open end of element 13, thus forming an aperture 64 through which the ion beam 15 passes. The purpose of covering 63 is to prevent scattered ions and other charged particles, such as electrons from impinging on the metallic conductors. A similar covering and aperture exists at the opposite end of element 13. As indicated in FIG. 3, the ion beam 15 enters element 13 from the left and exits element 13 to the right.

The operation of the preferred embodiment of the present invention will now be described in more detail using FIG. 2. The metallic cylinders, which form the perimeter of element 13, are schematically shown as conductors 21 through 36. As can be seen, conductors 21 through 36 are electrically isolated from each other. Resistors 41 through 56 are electrically connected between each adjacent pair of conductors. By connecting resistors 41 through 56 in this manner, a voltage divider network is formed on each of the four sides of element 13. When current is applied to the terminal pairs 16, 17 and 18,19 voltage drops are created across the voltage divider network which creates electric fields within element 13.

Current supplies 67 and 68 provide a source of DC current to the +Y and −Y terminals 16 and 17. This source of DC current creates a DC field within element 13 which acts on ion beam 15 so as to change the beam position in the Y direction at target 14. Likewise, current supplies 74 and 75 provide a source of DC current to the +X and −X terminals 18 and 19. This second source of DC current creates a DC field within element 13 which acts on ion beam 15 so as to change the beam position in the X direction at target 14.

Current supplies 69, 71 and 76, 77 provide a source of DC current to each of the terminal pairs 16, 17, and 18, 19, respectively. Together these two sources of DC current create a quadrupole DC field within element 13 which focuses ion beam 15 in the Y-direction.

Current supplies 72 and 73 provide a source of AC current to the +Y and −Y terminals 16 and 17. This source of AC current creates an AC field within element 13 which enables the scanning of ion beam 15 across target 14 in the Y direction. Similarly, current supplies 78 and 79 provide a source of AC current to the +X and −X terminals 18 and 19. This second source of AC current creates an AC field within element 13 which enables the scanning of ion beam 15 across target 14 in the X-direction. When current supplies 72, 73, 78, and 79 are turned on simultaneously, a raster type electric field is created which enables the raster scanning of ion beam 15 across target 14.

Each of the resistors 41 through 56 are equally valued having a resistance on the order of one megohm. When DC current supplies 67 and 68 are turned on, a uniform electric field is created within the substantially box-shaped element 13. If resistors 41 through 56 had different values, then the electric field set up within element 13 would not be uniform. Using a box-shaped configuration for element 13 along with equally valued resistors 41 through 56 produces a uniform electric field within element 13.

As is well known, electric field lines point in the direction from a positive terminal to a negative terminal. Looking at FIG. 2, it can be seen that the electric field lines which begin on one conductor of an opposing pair and end on the opposite conductor of the pair point from the plus terminal to the minus terminal. Thus, an electric field set up by current supplies 67 and 68 will point from conductor 25 to conductor 33. Likewise, the electric field that exists between conductors 26 and 32 will point from conductor 26 to conductor 32.

We will now examine the case when a DC current is provided to the terminals located at the opposite corners of element 13 from terminals 16 and 17. DC current supplies 74 and 75 provide a source of DC current to terminals 18 and 19 of element 13. By providing this DC current to terminals 18 and 19, a second uniform electric field is created which points in the direction from right to left, that is, an electric field line would begin, for example, on conductor 29 and terminate on conductor 21. Likewise, an electric field line would begin on conductor 28 and terminate on conductor 22 and so on. As in the previous case, using equally valued resistors 41 through 56 and a box-shaped configuration will produce a uniform electric field. The electric field strength produced as the result of application of DC current by DC current sources 74 and 75 will be uniform throughout element 13.

We will next examine the situation when DC current supplies 67, 68 and 74, 75 are turned on simultaneously. It is well known from Kirchoff's Law of Superimposition that superimposing one field upon another field will create a net field whose magnitude and direction is formed by the net result of the two fields. Recall that the electric field produced by current supplies 67 and 68 points in the direction from terminal 16 to terminal 17, i.e., it is a vertical field. Recall also that the electric field created by DC current supplies 74 and 75 points from terminal 18 to terminal 19, i.e., it is a horizontal field. These two electric fields interact to produce a net field that will point in a direction somewhere between the horizontal field produced by supplies 67 and 68 and the vertical field produced by supplies 74 and 75. For the sake of simplicity, we will assume that supplies 67,68 and 74, 75 are equally valued. As a result, the net electric field will point in a direction from the upper right hand side of element 13 to the lower left hand side of element 13. More specifically, the electric field lines will begin on conductors 26, 27, and 28, and will terminate on conductors 36, 35 and 34 respectively. The magnitude of the electric field will depend on the values of current provided by supplies 67, 68 and 74, 75. It must be emphasized that with both supplies 67, 68 and 74, 75 turned on, there exists only one electric field within structure 13, and it points from the upper right hand side of element 13 to the lower left hand side. The discussion concerning the two electric fields was merely a means of determining what the net result would be when all four terminals are activated using Kirchoff's Law of Superimposition.

The field produced by DC current supplies 67, 68 and 74, 75 is a DC or static one. This means that a charged particle placed within element 13 will be deflected to some location at the target depending upon the magnitude and direction of the electric field.

The function of DC current supplies 67, 68 and 74, 75 is to set up an electric field within element 13 that enables the positioning of the ion beam 15 within element 13. If no currents were applied to the four terminals 16, 17, 18, and 19, then an ion beam travelling down the axis of element 13 would continue down the axis undeflected. However, if it were desired to change the position of the ion beam from the axis of element 13, then it would be necessary to create a DC field to deflect the beam to the desired position within element 13. DC current supplies 67, 68 and 74, 75 are used to create the electric field which deflects ion beam 15 to the desired position. As previously mentioned, a beam of charged particles, such as an ion beam will be deflected in the presence of an electric field. DC current supplies 67, 68 and 74, 75 are capable of supplying variable amounts of current to element 13. The amounts of current supplied can be varied so as to modify the electric field acting on ion beam 15 so as to change the position of the ion beam 15.

AC current supplies 72, 73 and 78, 79 provide triangular-shaped AC currents to terminals 16, 17, and 18, 19, respectively. The previous explanation with respect to creation of DC fields within element 13 by the DC current supplies is applicable to the creation of AC fields within element 13 by AC current supplies 72, 73 and 78, 79 with one major exception. Whereas, in the DC case, the fields created acted to deflect the charged particle ion beam in a static manner, i.e., non-varying in time, the AC fields act to deflect the charged particle ion beam 15 in a dynamic manner. For example, activating AC current supplies 72 and 73 creates an AC field within element 19 that points from terminal 16 to terminal 17. However, this AC field will deflect a charged particle such as ion beam 15 dynamically along the direction of the field line, i.e., from terminal 16 to terminal 17. Thus, a charged particle ion beam will be deflected from the top of element 13 to the bottom of element 13 in a continuous manner. This continuous tracing of the charged particle beam from one end of element 13 to the other is quite similar to the continuous tracing of an electron beam across the face of a cathode ray tube (CRT). As long as AC current supplies 72 and 73 are operational, the charged particle beam will continue to be deflected in a direction from terminal 16 towards terminal 17.

When AC current supplies 78 and 79 are then turned on, the field produced coacts with the AC field produced by current supplies 72 and 73 to produce a resultant AC electric field whose field lines are formed in a raster type pattern. A charged particle ion beam 15 placed in a raster type AC field will be dynamically deflected across the entirety of target 14. For example, the ion beam 15 deflected by the raster field may be begin in one upper corner of target 14, be deflected across the surface of the target to the other side, be deflected an amount downwards, and then retrace its path across the target 14. The area scanned on target 14 using a raster type AC field to deflect ion beam 15 depends on the magnitude of currents supplied by the AC current supplies.

As can be seen, supplies 72 and 73 are connected to the Y-terminals 16 and 17 of element 13. Thus, to increase the scanning of ion beam 15 in the Y-direction across target 14, i.e., to increase the length that beam 15 is scanned in the Y-direction, it is necessary to increase the magnitude of the AC current supplied to terminals 16 and 17. Likewise, to increase the distance that ion beam 15 traverses across target 14 in the X-direction, it is necessary to increase the magnitude of the AC current supplied to terminals 18 and 19.

The frequencies that supplies 72, 73 and 78, 79 operate at must be different in order to produce a raster field. In the preferred embodiment described herein, supplies 72, 73 operate at a frequency of 1000 Hz while supplies 78, 79 operate at a frequency of 300 Hz.

DC current supplies 69 and 71 which are connected in parallel with DC current 67 and 68, provide a second DC current to terminals 16 and 17. Likewise, DC current supplies 76 and 77 which are connected in parallel with supplies 74 and 75 provide a second DC current to terminals 18 and 19. The purpose of current supplies 69, 71 and 76, 77 is to create a DC electric field within element 13 that serves to focus ion beam 15 in the Y-direction. Recall that focusing ion beam 15 in the Y-direction refers to the function of reducing the diameter of ion beam 15 in the Y-direction by exerting a force in the Y-direction on the charged particles in the beam which causes ion beam 15 to contract. The electric focusing field produced by supplies 69, 71 and 76, 77 is a quadrupole field. As is well known, a sextapole, octapole or any n-pole field can be used to focus ion beam 15 by adding an appropriate number of current supplies to the system.

The electric field resulting when all the DC current supplies 67, 68, 69, 71, 74, 75, 76 and 77 are turned on is determined using Kirchoff's Law of Superimposition. Any one or more of these supplies may be turned off and the resulting electric field will likewise be determined using Kirchoff's Law of Superimposition. For example, if it were not necessary to change the position of ion beam 15 in the Y-direction, then supplies 67 and 68 would be turned off and the resultant field would depend upon the current provided by sources 69, 71, 74, 74, 76 and 77.

In summary then, AC current supplies 72, 73, and 78, 79 provide AC currents to the Y and X-terminals of element 13, thereby producing a raster type scanned field. This raster field acts to deflect ion beam 15 in a dynamic manner across target 14. The width and length that ion beam 15 is scanned across target 14 depends on the magnitude of the currents supplied by AC current sources 67 and 71.

To focus ion beam 15 in the Y-direction, using multideflection element 13, a DC field is created within element 13 by DC current from DC supplies 69 and 71 to terminals 16 and 17 and from DC supplies 76 and 77 to terminals 18 and 19. This DC field exerts a contracting force on ion beam 15 so as to cause the beam to reduce its diameter in the Y-direction. Current supplies 67, 68, and 74, 75 provide DC currents to terminal pairs 16, 17, and 18, 19 respectively. These DC currents create two superimposed DC fields which produce a net DC field used to deflect the ion beam 15 in a static manner. By so doing, ion beam 15 is positioned at a desired point at target 14. Of course it would be possible to use only supplies 74, 75 if it were desired to change the position of ion beam 15 at target 14 in the X-direction only.

By activating all the current supplies, both AC and DC, it is possible to perform simultaneously the functions of positioning, scanning, and focusing (in the Y-direction) ion beam 15. It is also possible to selectively activate any one or more of the current supplies to provide the desired deflection function. As an example, current supplies 72, 73 and 78, 79 could be activated to provide X and Y-scanning, and current supplies 69, 71 and 76, 77 could be activated to provide Y-focusing. In this instance the rest of the current could be left off if no positioning of ion beam 15 were desired. Any combination of current supplies may be turned on simultaneously to perform any of the three functions of positioning, scanning, and focusing.

Although the best mode disclosed is a substantially box-shaped multi-deflection element, other shaped elements can be used. For example, a circular element with an appropriate choice of resistors could also accomplish simultaneous positioning, scanning, and focusing of a high current ion beam.

While current sources have been used in the preferred embodiment herein, it will be recognized to those skilled in the art that certain voltage sources may also be used.

While the invention has been particularly shown and described with reference to a preferred embodiment thereof, it will be understood by those skilled in the art that the foregoing and other changes in form and detail will be made therein without departing from the spirit and scope of the invention.

What is claimed is:

1. An ion beam system, including an ion source, adapted to project a high current ion beam along a path from aid ion source toward a target, said ion beam system comprising:
   first means for focusing in a first direction the ion beam exiting said ion source;
   second means for focusing in a second direction the ion beam exiting said first means and for simultaneously scanning such beam across said target, said second means comprising an open-ended substantially box-shaped structure, each of the four sides of said substantially box-shaped structure formed of spaced metallic conductors, adjacent pairs of said metallic conductors connected by resistive elements, said substantially box-shaped structure terminated at the four corners by two pairs of conductors with one conductor in each corner.

2. A system according to claim 1 wherein said second means further comprises a first source of DC current connected to a first pair of conductors and a second source of DC current connected to a second pair of conductors for focusing said ion beam in said second direction by creating a DC field within said substantially box-shaped structure, said DC field dependent upon the values of said first and second DC current sources and said resistive elements.

3. A system according to claim 2 wherein said second means further comprises a first source of AC current connected to said first pair of conductors for scanning said ion beam across said target in said second direction by creating a first AC field in said second direction within said substantially box-shaped structure, said first AC field dependent upon the values of said first AC current source and said resistive elements and upon the frequency of said first AC current source.

4. A system according to claim 3 wherein said second means further comprises a second source of AC current connected to a second pair of conductors for scanning said ion beam across said target in said first direction by creating a second AC field in said first direction within said substantially box-shaped structure, said second AC field dependent upon the values of said second AC current source and said resistive elements and upon the frequency of said second AC current source, said second AC field coacting with said first AC field to create a raster field, whereby said ion beam is scanned in a raster pattern across said target.

5. An ion beam system, including an ion source, adapted to project a high current ion beam along a path from said ion source toward a target, said ion beam system comprising:
   first means for focusing in a first direction the ion beam exiting said ion source;
   second means for focusing in a second direction the ion beam exiting said first means and for simultaneously positioning such beam, said second means comprising an open-ended substantially box-shaped structure, each of the four sides of said substantially box-shaped structure formed of spaced metallic conductors, adjacent pairs of said metallic conductors connected by resistive elements, said substantially box-shaped structure terminated at the four corners by two pairs of conductors with one conductor in each corner.

6. A system according to claim 5 wherein said second means further comprises a first source of DC current connected to a first pair of conductors and a second source of DC current connected to a second pair of conductors for focusing said ion beam in said second direction by creating a first DC field in said second direction within said substantially box-shaped structure, said first DC field dependent upon the values of said first and second DC current sources and said resistive elements.

7. A system according to claim 6 wherein said second means further comprises a third source of DC current connected to said first pair of conductors for positioning said ion beam in said second direction by modifying the magnitude of said first DC field by an amount dependent upon the value of said third DC current source.

8. A system according to claim 7 wherein said second means further comprises a fourth source of DC current connected to said second pair of conductors for positioning said ion beam in said first direction by creating a second DC field superimposed on said first DC field which exerts a force on said ion beam in said first direction, said second DC field dependent upon the values of said fourth DC current source and said resistive elements.

9. In an ion beam system, including an ion source, adapted to project a high current ion beam along a path from said ion source toward a target, apparatus for simultaneously positioning and scanning said ion beam comprising:
an open-ended substantially box-shaped structure, each of the four sides of said substantially box-shaped structure formed of spaced metallic conductors, adjacent pairs of said metallic conductors connected by resistive elements, said substantially box-shaped structure terminated at the four corners by two pairs of conductors with one conductor in each corner;
a first source of DC current connected to a first pair of conductors for positioning said ion beam in a first direction by creating a first DC field in said first direction within said substantially box-shaped structure, said first DC field dependent upon the values of said first DC current source and said resistive elements;
a second source of DC current connected to a second pair of conductors for positioning said ion beam in a second direction by creating a second DC field superimposed on said first DC field which exerts a force on said ion beam in said second direction, said second DC field dependent upon the values of said second DC current source and said resistive elements;
a first source of AC current connected to said first pair of conductors for scanning said ion beam across said target in said first direction by creating a first AC field in said first direction within said substantially box-shaped structure, said first AC field dependent upon the values of said first AC current source and said resistive elements and upon the frequency of said first AC current source; and
a second source of AC current connected to said second pair of conductors for scanning said ion beam across said target in a second direction by creating a second AC field in said second direction within said substantially box-shaped structure, said second AC field dependent upon the values of said second AC current source and said resistive elements and upon the frequency of said second AC current source, said second AC field coacting with said first AC field to create a raster field, whereby said ion beam is scanned in a raster pattern across said target.

10. An ion beam system, including an ion source, adapted to project a high current ion beam across a path from said ion source toward a target, said ion beam system comprising:
first means for focusing in a first direction the ion beam exiting said ion source;
second means for focusing in a second direction the ion beam exiting said first means and for simultaneously scanning and positioning such beam across said target, said second means comprising an open-ended substantially box-shaped structure, each of the four sides of said substantially box-shaped structure formed of spaced metallic conductors, adjacent pairs of said metallic conductors connected by resistive elements, said substantially box-shaped structures terminated at the four corners by two pairs of conductors with one conductor in each corner.

11. A system according to claim 10 wherein said second means further comprises a first source of DC current connected to a first pair of conductors and a second source of DC current connected to a second pair of conductors for focusing said ion beam in said second direction by creating a first DC field in said second direction within said substantially box-shaped structure, said first DC field dependent upon the values of said first and second DC current source and said resistive elements.

12. A system according to claim 11, wherein said second means further comprises a third source of DC current connected to said first pair of conductors for positioning said ion beam in said second direction by modifying the magnitude of said first DC field by an amount dependent upon the value of said third DC current source.

13. A system according to claim 12, wherein said second means further comprises a fourth source of DC current connected to a second pair of conductors for positioning said ion beam in said first direction by creating a second DC field superimposed on said first DC field which exerts a force on said ion beam in said first direction, said second DC field dependent upon the values of said fourth DC current source and said resistive elements.

14. A system according to claim 13 wherein said second means further comprises a first source of AC current connected to said first pair of conductors for scanning said ion beam across said target in said first direction by creating a first AC field in said first direction, dependent upon the values of said first AC current and said resistive elements and upon the frequency of said first AC current, within said substantially box-shaped structure.

15. A system according to claim 14 wherein said second means further comprises a second source of AC current connected to said second pair of conductors for scanning said ion beam across said target in said second direction by creating a second AC field in said second direction, dependent upon the values of said second AC current source and said resistive elements and upon the frequency of said second AC current, within said substantially box-shaped structure, said second AC field coacting with said first AC field to create a raster field, whereby said ion beam is raster scanned across said target.

16. In an ion beam system, including an ion source, adapted to project a high current ion beam along a path from said ion source to a target, apparatus for deflecting said ion beam comprising:
- a plurality of metallic conductors arranged in an open-ended substantially box-shaped configuration, said plurality of metallic conductors forming the edges of said box-shaped configuration with each of said plurality of metallic conductors electrically isolated from one another;
- a plurality of resistors, one of said plurality connected between each adjacent pair of metallic conductors, said plurality of resistors forming a voltage divider network with said plurality of metallic conductors;
- two pairs of electrical terminals, each terminal of said pair connected to one of the metallic conductors located at opposite corners of said substantially box-shaped configuration;
- a first source of DC current connected to a first pair of electrical terminals and a second source of DC current connected to a second pair of electrical terminals for focusing said ion beam in a first direction by creating a DC field in said first direction within said substantially box-shaped configuration, the magnitude of said DC field dependent upon the value of said first and second DC current source and upon voltage drops created by said voltage divider network across said substantially box-shaped configuration;
- a first source of AC current connected to the first pair of electrical terminals for scanning said ion beam in said first direction across said target by creating a first AC field superimposed upon said DC field within said substantially box-shaped configuration, said first AC field dependent upon the magnitude and frequency of said first AC current source and upon voltage drops created by said voltage divider network across said substantially box-shaped configuration; and
- a second source of AC current connected to a second pair of electrical terminals for scanning said ion beam in a second direction across said target by creating a second AC field in said direction within said substantially box-shaped configuration, said second AC field dependent upon the magnitude and frequency of said second AC current source and upon voltage drops created by said voltage divider network across said substantially box-shaped configuration, said second AC field coacting with said first AC field to produce a raster field, whereby said ion beam is raster scanned across said target.

17. In an ion beam system, including an ion source, adapted to project a high current ion beam along a path from said ion source to a target, apparatus for deflecting said ion beam comprising:
- a plurality of metallic conductors arranged in an open-ended substantially box-shaped configuration, said plurality of metallic conductors forming the edges of said box-shaped configuration with each of said plurality of metallic conductors electrically isolated from one another;
- a plurality of resistors, one of said plurality connected between each adjacent pair of metallic conductors, said plurality of resistors forming a voltage divider network with said plurality of metallic conductors;
- two pairs of electrical terminals, each terminal of said pair connected to one of the metallic conductors located at opposite corners of said substantially box-shaped configuration;
- a first source of DC current connected to a first pair of electrical terminals and a second source of DC current connected to a second pair of electrical terminals for focusing said ion beam in a first direction by creating a first DC field in said first direction within said substantially box-shaped configuration, the magnitude of said first DC field dependent upon the values of said first and second DC current sources and upon voltage drops created by said voltage divider network across said substantially box-shaped configuration;
- a third source of DC current connected to said first pair of electrical terminals for positioning said ion beam in said first direction by modifying the magnitude of said first DC field by an amount dependent upon the value of said third DC current source; and
- a fourth source of DC current connected to a second pair of electrical terminals for positioning said ion beam in a second direction by creating a second DC field superimposed on said first DC field which exerts a force on said ion beam in said second direction within said substantially box-shaped configuration, said second DC field dependent upon the value of said fourth DC current source and upon voltage drops created by said voltage divider network across said substantially box-shaped configuration.

18. In an ion beam system, including an ion source, adapted to project a high current ion beam along a path from said ion source to a target, apparatus for deflecting said ion beam comprising:
- a plurality of metallic conductors arranged in an open-ended substantially box-shaped configuration, said plurality of metallic conductors forming the edges of said box-shaped configuration with each of said plurality of metallic conductors electrically isolated from one another;
- a plurality of resistors, one of said plurality connected between each adjacent pair of metallic conductors, said plurality of resistors forming a voltage divider network with said plurality of metallic conductors;
- two pairs of electrical terminals, each terminal of said pair connected to one of the metallic conductors located at opposite corners of said substantially box-shaped configuration;
- a first source of DC current connected to a first pair of electrical terminals and a second source of DC current connected to a second pair of electrical terminals for focusing said ion beam in a first direction by creating a first DC field in said first direction within said substantially box-shaped configuration, the magnitude of said first DC field dependent upon the values of said first and second DC current sources and upon voltage drops created by said voltage divider network across said substantially box-shaped configuration;
- a third source of DC current connected to said first pair of electrical terminals for positioning said ion beam in said first direction by modifying the magnitude of said first DC field by an amount dependent upon the value of said third DC current source;
- a fourth source of DC current connected to a second pair of electrical terminals positioning said ion beam in a second direction by creating a second DC field superimposed on said first DC field which exerts a force on said ion beam in said second direction within said substantially box-shaped configuration, said second DC field dependent upon the value of said fourth DC current source and upon voltage drops created by said voltage divider network across said substantially box-shaped configuration;

a first source of AC current connected to the first pair of electrical terminals for scanning said ion beam in a first direction across said target by creating a first AC field superimposed upon said first DC field within said substantially box-shaped configuration, said first AC field dependent upon the magnitude and frequency of said first AC current source and upon voltage drops created by said voltage divider network across said substantially box-shaped configuration; and a second source of AC current connected to said second pair of electrical terminals for scanning said ion beam in a second direction across said target by creating a second AC field within said substantially box-shaped configuration, said second AC field dependent upon the magnitude and frequency of said second AC current source and upon voltage drops created by said voltage divider network across said substantially box-shaped configuration, said second AC field coacting with said first AC field to produce a raster field, whereby said ion beam is raster scanned across said target.

* * * * *

UNITED STATES PATENT AND TRADEMARK OFFICE
CERTIFICATE OF CORRECTION

PATENT NO.   : 4,556,823
DATED        : December 3, 1985
INVENTOR(S)  : John H. Keller et al It is certified that error appears in the above-identified patent and that said Letters Patent is hereby corrected as shown below:

Claim 1 -- Col. 10, line 4     Delete "aid" and insert therefor --said--.

Signed and Sealed this

Third Day of June 1986

[SEAL]

Attest:

Attesting Officer

DONALD J. QUIGG

Commissioner of Patents and Trademarks